(12) United States Patent
Yoshida et al.

(10) Patent No.: US 9,065,003 B2
(45) Date of Patent: Jun. 23, 2015

(54) SEMICONDUCTOR LIGHT EMITTING DEVICE AND SEMICONDUCTOR WAFER

(75) Inventors: Hisashi Yoshida, Kanagawa-ken (JP);
Koichi Tachibana, Kanagawa-ken (JP);
Tomonari Shioda, Kanagawa-ken (JP);
Toshiki Hikosaka, Kanagawa-ken (JP);
Jongil Hwang, Kanagawa-ken (JP);
Hung Hung, Kanagawa-ken (JP);
Naoharu Sugiyama, Kanagawa-ken (JP); Shinya Nunoue, Chiba-ken (JP)

(73) Assignee: Kabushiki Kaisha Toshiba, Tokyo (JP)

(*) Notice: Subject to any disclaimer, the term of this patent is extended or adjusted under 35 U.S.C. 154(b) by 213 days.

(21) Appl. No.: 13/405,509

(22) Filed: Feb. 27, 2012

(65) Prior Publication Data
US 2013/0087760 A1 Apr. 11, 2013

(30) Foreign Application Priority Data

Oct. 11, 2011 (JP) .................................. 2011-224368

(51) Int. Cl.
*H01L 29/06* (2006.01)
*H01L 33/12* (2010.01)
*H01L 33/32* (2010.01)
*H01L 33/02* (2010.01)

(52) U.S. Cl.
CPC ............... *H01L 33/12* (2013.01); *H01L 33/32* (2013.01); *H01L 33/02* (2013.01)

(58) Field of Classification Search
None
See application file for complete search history.

(56) References Cited

U.S. PATENT DOCUMENTS

| 8,779,468 B2* | 7/2014 | Fang et al. ..................... 257/190 |
| 2002/0013042 A1* | 1/2002 | Morkoc ......................... 438/604 |
| 2006/0191474 A1* | 8/2006 | Chen et al. ..................... 117/104 |
| 2008/0128707 A1* | 6/2008 | Horino ............................ 257/76 |
| 2010/0133658 A1* | 6/2010 | Dadgar et al. ................ 257/615 |
| 2011/0284824 A1* | 11/2011 | Liu et al. ......................... 257/13 |
| 2014/0110754 A1* | 4/2014 | Jain et al. ...................... 257/190 |

FOREIGN PATENT DOCUMENTS

| JP | 2004-296717 A | 10/2004 |
| JP | 2009-81472 | 4/2009 |
| JP | 2010-525595 A | 7/2010 |
| JP | 2010-251738 A | 11/2010 |

OTHER PUBLICATIONS

JP 2010-251738 English Machine Translation.*

(Continued)

*Primary Examiner* — Mark Tornow
*Assistant Examiner* — Priya Rampersaud
(74) *Attorney, Agent, or Firm* — Oblon, McClelland, Maier & Neustadt, L.L.P.

(57) ABSTRACT

According to one embodiment, a semiconductor light emitting device includes a first semiconductor layer of a first conductivity type, a second semiconductor layer of a second conductivity type, and a light emitting layer provided between the first semiconductor layer and the second semiconductor layer and configured to emit a light having a peak wavelength of 440 nanometers or more. Tensile strain is applied to the first semiconductor layer. An edge dislocation density of the first semiconductor layer is $5 \times 10^9 / cm^2$ or less. A lattice mismatch factor between the first semiconductor layer and the light emitting layer is 0.11 percent or less.

21 Claims, 9 Drawing Sheets

(56) References Cited

OTHER PUBLICATIONS

Krasovitskiy, D., Alexeev, A., Byrnaz, A., Kokin, S., Pavlenko, M., Petrov, S., Pogorelsky, M., Pogorelsky, Y., Sokolov, I., Sokolov, M., Shkurko, A. and Chaly, V. (2009), AlN/AlGaN/GaN/AlGaN multilayer heterostructures with quantum well channel on heat conducting substrates for power microwave transistors. Phys. Status Solidi C, 6: S956-S959.*

Japanese Office Action Issued Aug. 10, 2012 in Patent Application No. 2011-224368 (with English translation).

Baijun Zhang et al., "High-Bright InGaN Multiple-Quantum-Well Blue Light-Emitting Diodes on Si(111) Using AlN/GaN Multilayers with a Thin AlN/AlGaN Buffer Layer", Japanese Journal of Applied Physics, vol. 42, Part 2, No. 3A, Mar. 1, 2003, pp. L226-L228.

U.S. Appl. No. 13/868,275, filed Apr. 23, 2013, Harada, et al.

* cited by examiner

SEMICONDUCTOR LIGHT EMITTING DEVICE AND SEMICONDUCTOR WAFER

CROSS-REFERENCE TO RELATED APPLICATIONS

This application is based upon and claims the benefit of priority from the prior Japanese Patent Application No. 2011-224368, filed on Oct. 11, 2011; the entire contents of which are incorporated herein by reference.

FIELD

Embodiments described herein relate generally to a semiconductor light emitting device and a semiconductor wafer.

BACKGROUND

Light emitting diodes (LEDs) that are semiconductor light emitting devices using a nitride semiconductor are used in display devices, lighting, or the like, for example. Electronic devices using a nitride semiconductor are used for high speed electronic devices or power devices.

In such semiconductor light emitting devices, a quantum well layer using $In_xGa_{1-x}N$ is provided on a GaN layer. In this provision, a defect is introduced because of a lattice constant difference between the foundation GaN layer and the quantum well layer. This defect reduces luminous efficiency.

DETAILED DESCRIPTION

Figure 1:
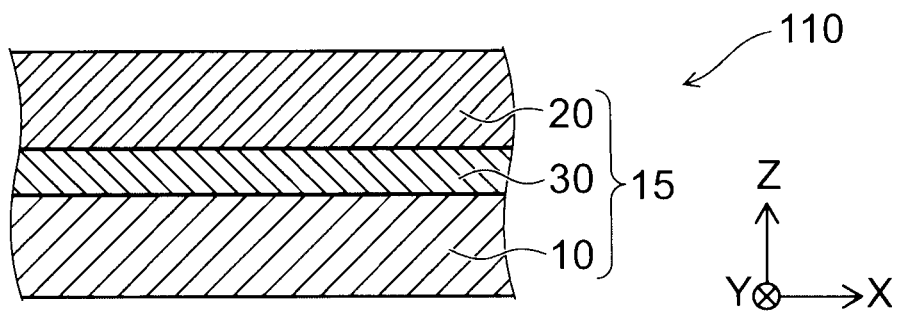
FIG. 1 is a schematic cross-sectional view showing a semiconductor light emitting device according to a first embodiment.

According to one embodiment, a semiconductor light emitting device includes a first semiconductor layer of a first conductivity type, a second semiconductor layer of a second conductivity type, and a light emitting layer provided between the first semiconductor layer and the second semiconductor layer and configured to emit a light having a peak wavelength of 440 nanometers or more. Tensile strain is applied to the first semiconductor layer. An edge dislocation density of the first semiconductor layer is $5 \times 10^9/cm^2$ or less. A lattice mismatch factor between the first semiconductor layer and the light emitting layer is 0.11 percent or less.

According to another embodiment, a semiconductor wafer includes a silicon substrate, a buffer layer provided on the silicon substrate, a first semiconductor layer of a first conductivity type provided on the buffer layer, a light emitting layer provided on the first semiconductor layer and configured to emit a light having a peak wavelength of 440 nanometer or more, and a second semiconductor layer of a second conductivity type provided on the light emitting layer. Tensile strain is applied to the first semiconductor layer. An edge dislocation density of the first semiconductor layer is $5 \times 10^9/cm^2$ or less. A lattice mismatch factor between the first semiconductor layer and the light emitting layer is 0.11 percent or less.

Various embodiments will be described hereinafter with reference to the accompanying drawings.

The drawings are schematic or conceptual; and the relationships between the thickness and width of portions, the proportional coefficients of sizes among portions, etc., are not necessarily the same as the actual values thereof. Further, the dimensions and proportional coefficients may be illustrated differently among drawings, even for identical portions.

In the specification and drawings, components similar to those described or illustrated in a drawing thereinabove are marked with like reference numerals, and a detailed description is omitted as appropriate.

First Embodiment

FIG. 1 is a schematic cross-sectional view illustrating the configuration of a semiconductor light emitting device according to a first embodiment. As shown in FIG. 1, a semiconductor light emitting device 110 according to the embodiment includes a first semiconductor layer 10, a second semiconductor layer 20, and a light emitting layer 30. The light emitting layer 30 is provided between the first semiconductor layer 10 and the second semiconductor layer 20.

The first semiconductor layer 10 is of a first conductivity type. The second semiconductor layer 20 is of a second conductivity type different from the first conductivity type. For example, the first conductivity type is an n-type, and the second conductivity type is a p-type. The embodiment is not limited thereto. The first conductivity type may be a p-type, and the first conductivity type may be an n-type. In the following, the case will be described where the first conductivity type is an n-type and the second conductivity type is a p-type.

A first electrode, not shown, is electrically connected to the first semiconductor layer 10, and a second electrode, not shown, is electrically connected to the second semiconductor layer 20. A voltage is applied to these electrodes, so that a current is supplied to the light emitting layer 30 through the first semiconductor layer and the second semiconductor layer 20, and light is emitted from the light emitting layer 30. The peak wavelength of light emitted from the light emitting layer 30 is 440 nanometer (nm) or more. An exemplary configuration of the light emitting layer 30 will be described later.

Here, for convenience of explanation, a direction from the first semiconductor layer 10 toward the second semiconductor layer 20 is a stacking direction (a Z-axis direction). A direction vertical to the Z-axis direction is an X-axis direction. A direction vertical to the Z-axis direction and the X-axis direction is a Y-axis direction.

A stacked body 15 including the first semiconductor layer 10, the light emitting layer 30, and the second semiconductor layer 20 is epitaxially grown on a silicon substrate. This silicon substrate may be removed after epitaxially growing the stacked body 15. In the following, an exemplary configuration before removing the silicon substrate will be described. Namely, the semiconductor light emitting device according to the embodiment can further include this silicon substrate.

Figure 2:
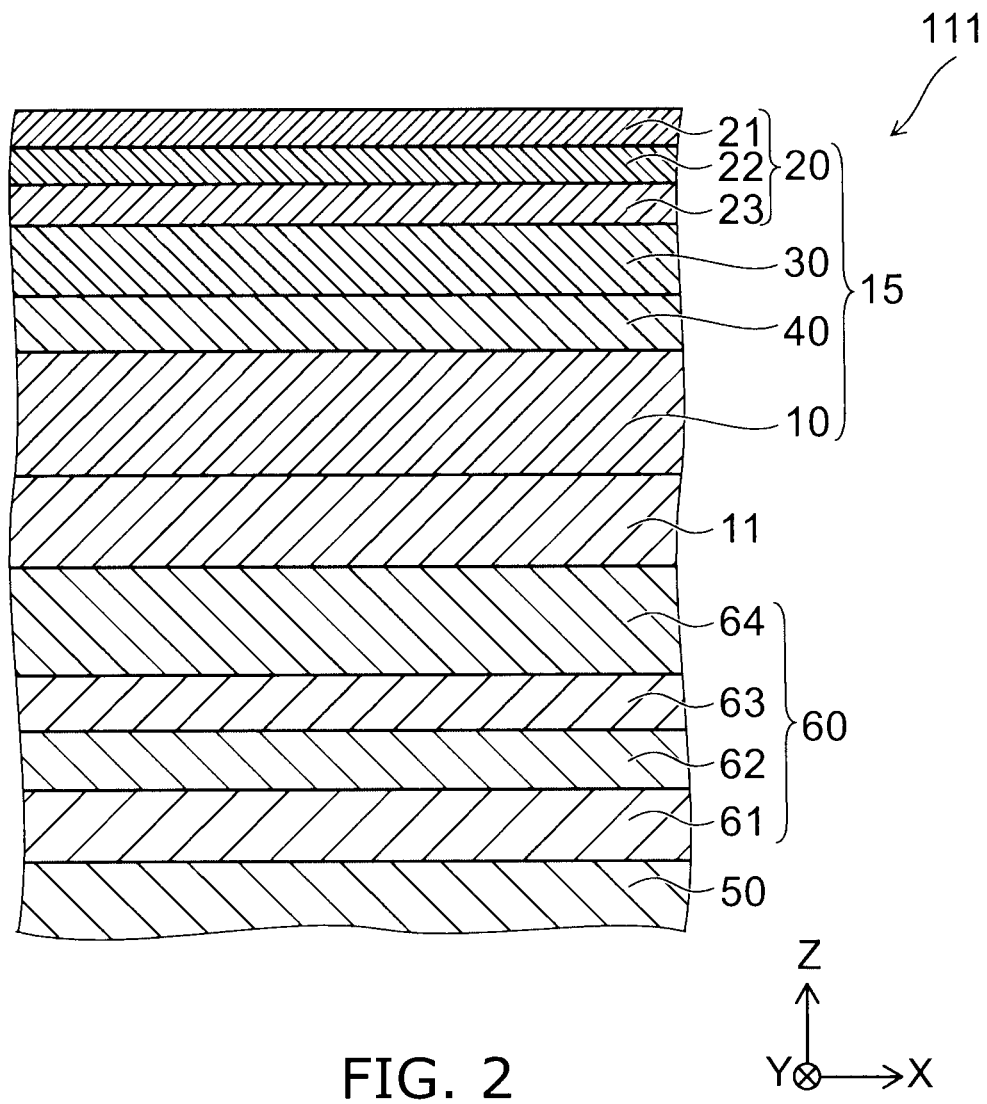
FIG. 2 is a schematic cross-sectional view showing another semiconductor light emitting device according to the first embodiment.

FIG. 2 is a schematic cross-sectional view illustrating the configuration of another semiconductor light emitting device according to the first embodiment.

As shown in FIG. 2, a semiconductor light emitting device 111 according to the embodiment further includes a silicon substrate 50 and a buffer layer 60, in addition to a first semiconductor layer 10, a light emitting layer 30, and a second semiconductor layer 20.

The silicon substrate 50 is provided on a side opposite to the second semiconductor layer 20 of the first semiconductor layer 10. The buffer layer 60 is provided between the silicon substrate 50 and the first semiconductor layer 10. The buffer layer 60 includes a nitride semiconductor. The first semiconductor layer 10 is disposed between the silicon substrate 50 and the second semiconductor layer 20.

The buffer layer 60 includes a first foundation layer 61, a second foundation layer 62, a third foundation layer 63, and a fourth foundation layer 64, for example. The first foundation layer 61 is provided between the silicon substrate 50 and the first semiconductor layer 10. The second foundation layer 62 is provided between the first foundation layer 61 and the first semiconductor layer 10. The third foundation layer 63 is provided between the second foundation layer 62 and the first semiconductor layer 10. The fourth foundation layer 64 is provided between the third foundation layer 63 and the first semiconductor layer 10. Namely, the buffer layer 60 is provided on the silicon substrate 50. More specifically, the first foundation layer 61, the second foundation layer 62, the third foundation layer 63, and the fourth foundation layer 64 are provided on the silicon substrate 50 in this order. The first semiconductor layer 10 is provided on the fourth foundation layer 64.

The first foundation layer 61 includes AlN. An AlN layer, for example, is used for the first foundation layer 61. The second foundation layer 62 includes $Al_{x1}Ga_{1-x1}N$ ($0 \leq x1 \leq 1$). AlGaN, for example, is used for the second foundation layer 62. The third foundation layer 63 includes GaN. An exemplary configuration of the fourth foundation layer 64 will be described later.

In this example, the semiconductor light emitting device 111 further includes a low impurity layer 11. The low impurity layer 11 is provided between the buffer layer 60 (more specifically, the fourth foundation layer 64) and the first semiconductor layer 10. The impurity concentration of the low impurity layer 11 is lower than the impurity concentration of the first semiconductor layer 10. A non-doped GaN layer (an i-GaN layer), for example, is used for the low impurity layer 11.

In this example, the semiconductor light emitting device 111 further includes a multi-layer structure unit 40 provided between the first semiconductor layer 10 and the light emitting layer 30. The multi-layer structure unit 40 is provided as necessary, which may be omitted. An exemplary configuration of the multi-layer structure unit 40 will be described later.

The second semiconductor layer 20 can include a first p-type layer 21, a second p-type layer 22, and a third p-type layer 23. The second p-type layer 22 is provided between the first p-type layer 21 and the light emitting layer 30. The third p-type layer 23 is provided between the second p-type layer 22 and the light emitting layer 30. The first p-type layer 21 is a contact layer, and includes a p-type impurity at high concentration. A p-type GaN layer can be used for the first p-type layer 21. The second p-type layer 22 includes a p-type impurity at a concentration lower than the concentration of the first p-type layer 21. A p-type GaN layer can be used for the second p-type layer 22. A p-type AlGaN layer, for example, can be used for the third p-type layer 23.

Figure 3:
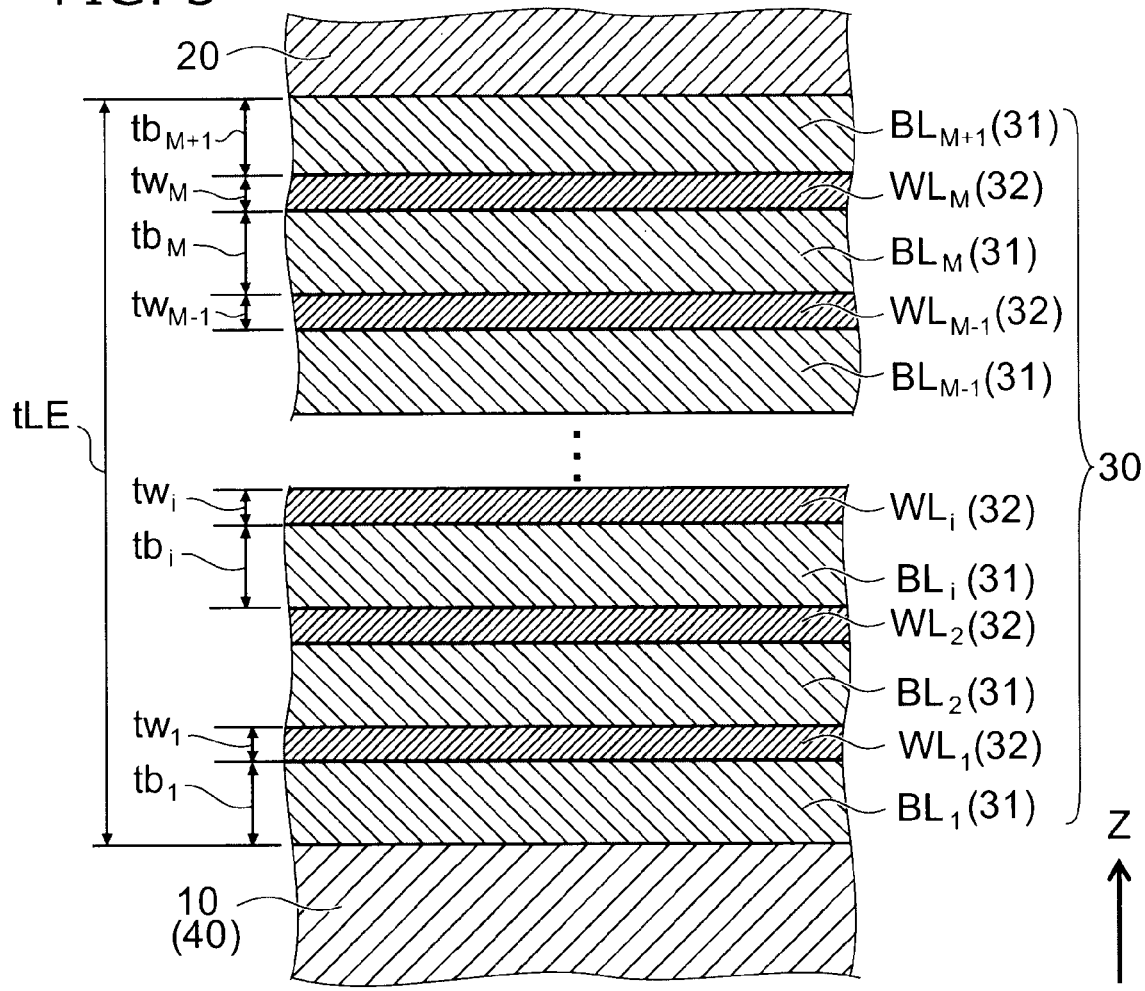
FIG. 3 is a schematic cross-sectional view showing a part of the semiconductor light emitting device according to the first embodiment.

FIG. 3 is a schematic cross-sectional view partially illustrating the configuration of the semiconductor light emitting device according to the first embodiment.

FIG. 3 shows an exemplary configuration of the light emitting layer 30. As shown in FIG. 3, the light emitting layer 30 includes a plurality of barrier layers 31 and a well layer 32 provided between the plurality of barrier layers 31. The barrier layer 31 and the well layer 32 are stacked along the Z-axis direction.

In the specification, the term "stacked state" includes a state in which a layer is directly laid on another layer as well as a state in which a layer is laid on another layer as an element is sandwiched therebetween. The number of the well layers 32 may be one, or may be two or more. Namely, the light emitting layer 30 can have an SQW (Single-Quantum Well) structure, or an MQW (Multi-Quantum Well) structure.

The band gap energy of the barrier layer 31 is larger than the band gap energy of the well layer 32. $In_{w0}Ga_{1-w0}N$ ($0<w0<1$), for example, is used for the well layer 32. GaN, for example, is used for the barrier layer 31.

The barrier layer 31 includes a nitride semiconductor containing a III group element and a V group element. The well layer 32 includes a nitride semiconductor containing a III group element and a V group element. The well layer 32 includes a nitride semiconductor containing indium (In) and gallium (Ga).

Here, suppose that the number of the barrier layers 31 is N (N and M are an integer of two or more). Suppose that the number of the well layers 32 is M (2M is an integer of two or more). In the embodiment, for example, N may be the same as M, or N may be (M+1). In the following, the case will be described where N is (M+1).

A barrier layer 31 closest to the first semiconductor layer 10 of the plurality of barrier layers 31 is a first barrier layer $BL_1$. Suppose that a second barrier layer $BL_2$ to a (M+1)th barrier layer $BL_{M+1}$ (that is, an Nth barrier layer $BL_N$) are arranged in this order along the Z-axis direction from the first semiconductor layer to the second semiconductor layer 20.

Namely, the (i+1)th barrier layer $BL_{(i+1)}$ (i is an integer ranging from one to an integer less than M) is disposed between an ith barrier layer $BL_i$ and the second semiconductor layer 20.

Suppose that a well layer 32 closest to the first semiconductor layer 10 of a plurality of well layers 32 is a first well layer $WL_1$. Suppose that a second well layer $WL_2$ to an Mth well layer $WL_M$ are arranged in this order along a positive Z-axis direction from the first semiconductor layer 10 to the second semiconductor layer 20. The first barrier layer $BL_1$ is disposed between the first semiconductor layer 10 and the first well layer $WL_1$.

The ith well layer $WL_1$ is disposed between the ith barrier layer $BL_i$ and the (i+1)th barrier layer $BL_{(i+1)}$. Namely, the ith well layer $WL_i$ is disposed between the ith barrier layer $BL_i$ and the second semiconductor layer $BL_2$. In the case where N is (M+1), the (M+1)th barrier layer $BL_{(M+1)}$ is disposed between the Mth well layer $WL_M$ and the second semiconductor layer $BL_2$.

Suppose that the ith barrier layer $BL_1$ includes $In_{xbi}Ga_{1-xbi}N$ (0≤xbi<1). Suppose that the thickness (the length along the Z-axis direction) of the ith barrier layer $BL_i$ is $tb_i$. Suppose that the ith well layer $WL_i$ includes $In_{xwi}Ga_{1-xwi}N$ (0<xwi<1). Suppose that the thickness (the length along the Z-axis direction) of the ith well layer $WL_i$ is twi.

Based on these values, an average In composition ratio α of the light emitting layer 30 is found according to Equation 1 below.

$$\alpha = \frac{\sum_{i=1}^{M}(xw_i \cdot tw_i) + \sum_{i=1}^{N}(xb_i \cdot tb_i)}{\sum_{i=1}^{M} tw_i + \sum_{i=1}^{N} tb_i} \quad (1)$$

For example, in the case where the barrier layer 31 is GaN, the thickness of the barrier layer 31 is 5 nm, the number of the barrier layers 31 is nine, the well layer 32 is $In_{0.15}Ga_{0.85}N$, the thickness of the well layer 32 is 3.3 nm, and the number of the well layers 32 is eight, the average In composition ratio α of the light emitting layer 30 is about 5.5%.

Since the light emitting layer 30 is provided with the barrier layer 31 and the well layer 32 having a different composition from the composition of the barrier layer 31, in the following, the average In composition ratio α of the light emitting layer 30 is used for the average characteristic of the light emitting layer 30.

Suppose that the entire thickness of the light emitting layer is a light emitting layer thickness tLE.

Figure 4:
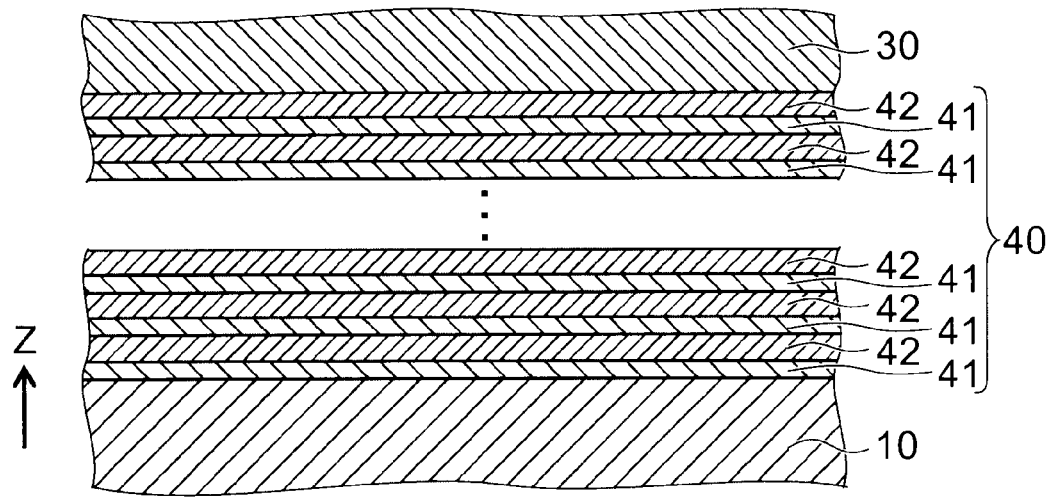
FIG. 4 is a schematic cross-sectional view showing a part of the semiconductor light emitting device according to the first embodiment.

FIG. 4 is a schematic cross-sectional view partially illustrating the configuration of the semiconductor light emitting device according to the first embodiment.

FIG. 4 shows an exemplary configuration of the multi-layer structure unit 40. As shown in FIG. 4, the multi-layer structure unit 40 includes a plurality of first layers 41 and a plurality of second layers 42 alternately stacked along the Z-axis direction. GaN, for example, is used for the first layer 41, and InGaN, for example, is used for the second layer 42. The thickness of the first layer 41 is 2.7 nm, for example. The thickness of the second layer 42 is 1.0 nm, for example. The number of the first layers 41 and the number of the second layers 42 (that is, the pair number) are not less than 10 and not more than 40, for example. For example, the multi-layer structure unit 40 is a superlattice layer. As already described, the multi-layer structure unit 40 may be provided as necessary, or may be omitted.

Figure 5:
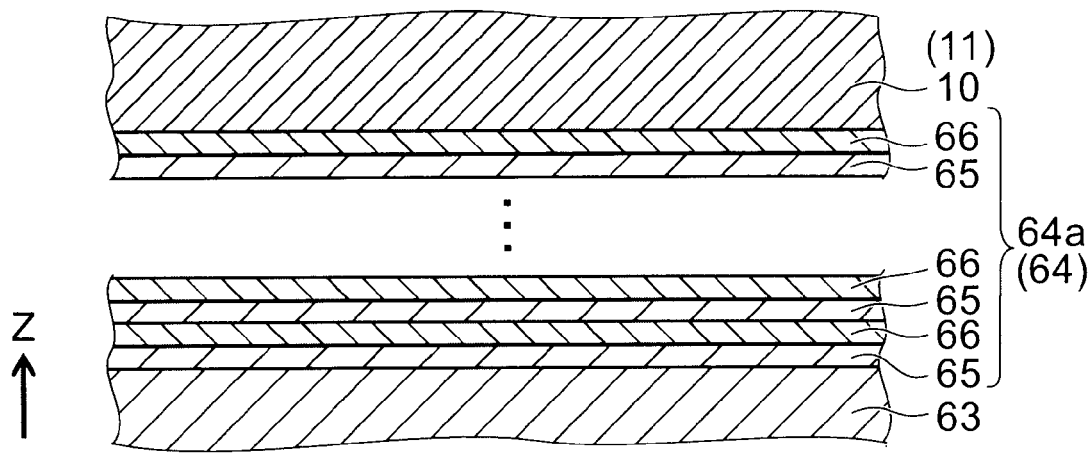
FIG. 5 is a schematic cross-sectional view showing a part of the semiconductor light emitting device according to the first embodiment.

FIG. 5 is a schematic cross-sectional view partially illustrating the configuration of the semiconductor light emitting device according to the first embodiment.

FIG. 5 shows an exemplary configuration (a fourth foundation layer 64a) of the fourth foundation layer 64. As shown in FIG. 5, in this example, the fourth foundation layer 64a includes a plurality of AlN layers 65 and a plurality of GaN layers 66 alternately stacked along the Z-axis direction. The AlN layer 65 is a low temperature grown AlN layer, for example. The thickness of the AlN layer 65 is about 18 nm, for example. The thickness of the GaN layer 66 is about 240 nm, for example. The number of the plurality of AlN layers 65 and the number of the plurality of GaN layers 66 (that is, the pair number) are not less than 2 and not more than 10, for example.

Figure 6:
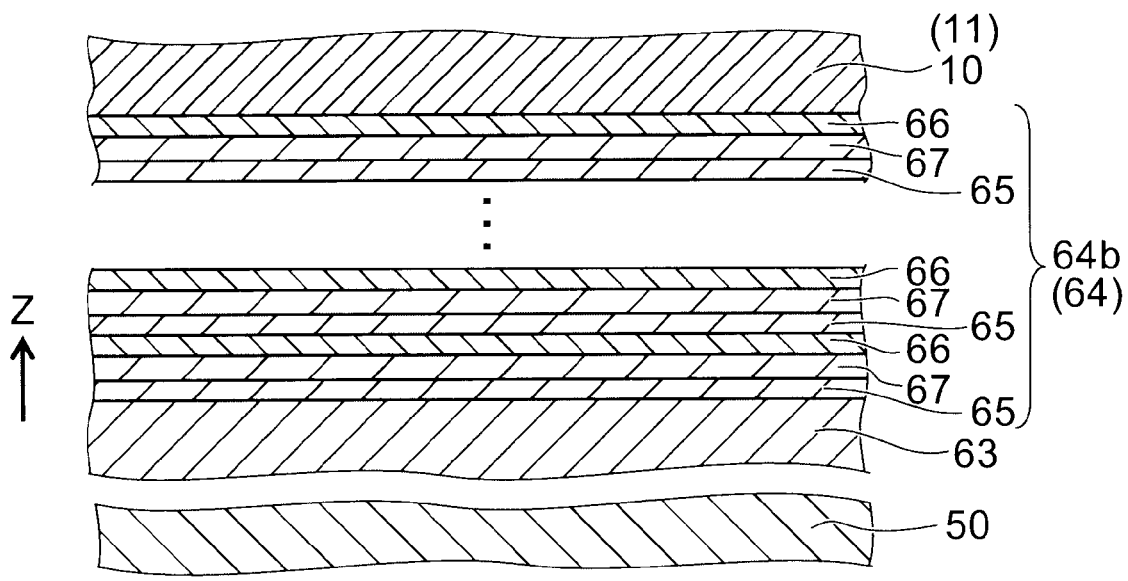
FIG. 6 is a schematic cross-sectional view showing a part of the semiconductor light emitting device according to the first embodiment.

FIG. 6 is a schematic cross-sectional view partially illustrating the configuration of the semiconductor light emitting device according to the first embodiment.

FIG. 6 shows another exemplary configuration (a fourth foundation layer 64b) of the fourth foundation layer 64. As shown in FIG. 6, the fourth foundation layer 64b further includes a plurality of AlGaN layers 67, in addition to a plurality of AlN layers 65 and a plurality of GaN layers 66. The AlGaN layer 67 is provided between each of the plurality of GaN layers 66 and each AlN layer 65 on the silicon substrate 50 side of the GaN layer 66. Namely, the AlN layer 65 is provided on the silicon substrate 50 (more specifically, on the third foundation layer 63), the AlGaN layer 67 is provided on the AlN layer 65, and the GaN layer 66 is provided on the AlGaN layer 67. A stacked body including the AlN layer 65, the AlGaN layer 67, and the GaN layer 66 is repeatedly stacked along the Z-axis direction. The number of the AlN layers 65, the number of the AlGaN layers 67, and the number of the GaN layers 66 (the number of stacked layers) are not less than 2 and not more than 10, for example.

The description above is made as for an exemplary configuration of the semiconductor light emitting device 110 (and 111) according to the embodiment. The embodiment can be variously modified and altered as described later. In the following, the semiconductor light emitting device 111 will be described. The description below is also applied to the semiconductor light emitting device 110.

In the semiconductor light emitting device 111 according to the embodiment, tensile strain is applied to the first semiconductor layer 10. More specifically, tensile strain having a component vertical to the Z-axis direction is applied to the first semiconductor layer 10. At this time, compressive strain is applied along the Z-axis direction. This tensile strain is caused from a thermal expansion coefficient difference between the silicon substrate 50 and the first semiconductor layer 10.

Figure 7:
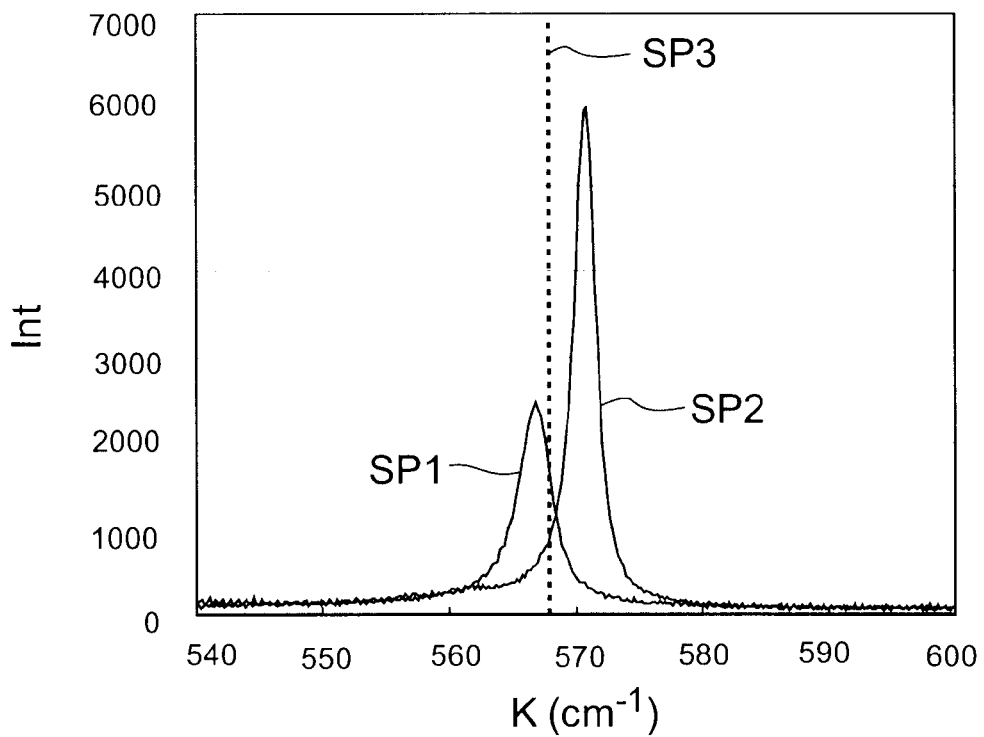
FIG. 7 to FIG. 13 are graphs showing the characteristics of the semiconductor light emitting device.

FIG. 7 is a graph illustrating the characteristics of the semiconductor light emitting device.

FIG. 7 illustrates the results of Raman spectrometry for the GaN layer. In this spectrometry, the measured results of a sample SP1 that is a GaN layer formed on the silicon substrate 50 and a sample SP2 that is a GaN layer formed on a sapphire substrate are shown. The horizontal axis represents a wave number K ($cm^{-1}$). The vertical axis represents an intensity Int (an arbitrary scale). FIG. 7 shows, for a sample SP3, the wave number K of a GaN substrate corresponding to a state in which no stress is applied.

As shown in FIG. 7, in the sample SP3 in the state in which no stress is applied, the wave number K is about 568 $cm^{-1}$. On the other hand, in the sample SP1 that is the GaN layer formed on the silicon substrate 50, the wave number K at which the intensity Int is a peak is about 566 $cm^{-1}$. On the other hand, in the sample SP2 that is the GaN layer formed on the sapphire substrate, the wave number K at which the intensity Int is a peak is about 572 $cm^{-1}$.

In the sample SP1 that is the GaN layer formed on the silicon substrate 50, tensile strain (tensile strain in the direction vertical to the Z-axis direction) is applied to the GaN layer. In this application, the wave number K becomes smaller than the wave number K of the GaN layer to which no strain is applied. On the contrary, when compressive strain is applied the GaN layer, the wave number K becomes larger than the wave number K of the GaN layer to which no strain is applied.

In the embodiment, the first semiconductor layer 10 is formed on the silicon substrate 50, and tensile strain is applied to this first semiconductor layer 10. The composition of the first semiconductor layer 10 is found from chemical composition analysis and a wave number K based on the found composition and a wave number K based on the result of the first semiconductor layer 10 subjected to Raman spectroscopic analysis are compared with each other, so that the state of strain of the first semiconductor layer 10 can be known.

In the semiconductor light emitting device 111 according to the embodiment, a lattice mismatch factor (lattice mismatch) LM1 between the first semiconductor layer 10 and the light emitting layer 30 is 0.11 percent (%) or less. Here, the lattice mismatch factor LM1 is expressed by Equation 2 below.

$$LM1=(WLE-W1)/W1\times100(\%) \quad (2)$$

Where W1 is a lattice length of the first semiconductor layer in an a-axis direction. WEL is a lattice length of the light emitting layer 30 in an a-axis direction. The lattice mismatch factor LM1 is found from X-ray diffraction measurement. The lattice mismatch factor LM1 can be found from reciprocal lattice space mapping, for example.

In the embodiment, an edge dislocation density of the first semiconductor layer 10 is $5\times10^9/cm^2$ or less. The edge dislocation density is a value found from the rocking curve half width of a symmetry plane and an asymmetry plane of a sample in X-ray diffraction measurement of the sample.

As described above, in the semiconductor light emitting device 111 according to the embodiment, the edge dislocation density of the first semiconductor layer 10 is $5\times10^9/cm^2$ or less, and a lattice mismatch factor LM1 between the first semiconductor layer 10 and the light emitting layer 30 in the a-axis direction is 0.11% or less.

The conditions were found from an original experiment conducted by the inventors. In the following, this experiment will be described. In the experiment, samples were prepared in which the conditions of forming the buffer layer 60, the low impurity layer 11, and the stacked body 15 were changed.

The conditions for a first sample S01 are as follows. The first foundation layer 61 is an AlN layer having a thickness of 100 nm. The second foundation layer 62 is an AlGaN layer having a thickness of 250 nm. The third foundation layer 63 is an i-GaN layer (a non-doped GaN layer) having a thickness of 300 nm. The fourth foundation layer 64 has a configuration in which a stacked layer film formed of an AlN layer 65 having a thickness of 18 nm, an AlGaN layer 67 having a thickness of 60 nm, and a GaN layer having a thickness of 240 nm is stacked in four cycles. The low impurity layer 11 is an i-GaN layer having a thickness of 1000 nm. The first semiconductor layer 10 is an n-type GaN layer having a thickness of 1000 nm. In the multi-layer structure unit 40, the first layer 41 is GaN having a thickness of 2.7 nm, the second layer 42 is an InGaN layer having a thickness of 1.0 nm, and the number of stacked layers of the first layer 41 and the second layer 42 is 30. In the light emitting layer 30, the barrier layer 31 is a GaN layer having a thickness of 5 nm, and the well layer 32 is an $In_{0.15}Ga_{0.85}N$ layer having a thickness of 3.3 nm. The number of the barrier layers 31 is nine, and the number of the well layers 32 is eight. The third p-type layer 23 is a p-type AlGaN layer having a thickness of 5 nm. The second p-type layer 22 is a p-type GaN layer having a thickness of 80 nm and an impurity concentration of $2\times10^{19}/cm^3$. The first p-type layer 21 is a p-type GaN layer having a thickness of 5 nm and an impurity concentration of $2\times10^{21}/cm^3$. The thickness of the second semiconductor layer 20 is about 100 nm.

The preparation conditions for the first sample S01 are as follows. Metal-organic chemical vapor deposition (MOCVD) is used for crystal growth. The AlN layer (the first foundation layer 61) is grown on the silicon substrate 50 at a temperature of 1,220° C. The AlGaN layer (the second foundation layer 62) is grown at a temperature of 1,190° C. The i-GaN layer (the third foundation layer 63) is grown at a temperature of 1,250° C. The AlN layer 65, the AlGaN layer 66, and the GaN layer 67 are repeatedly grown in four cycles for the fourth foundation layer 64. The i-GaN layer (the low impurity layer 11) is grown at a temperature of 1,250° C. In this growth, the ratio of the amount of the V group element to the amount of the III group element (the V-to-III ratio) is set to 1949. The Si-doped n-type GaN layer (the first semiconductor layer 10) is grown. The light emitting layer 30 and the second semiconductor layer 20 are grown. Thus, the first sample S01 is formed.

In a second sample S02, the thickness of the barrier layer 31 is 10 nm. The configuration and the preparation conditions other than this are the same as those for the first sample S01.

In a third sample S03, the number of the barrier layers 31 is seven, and the number of the well layers 32 is six. The configuration and the preparation conditions other than these are the same as those for the first sample S01.

In a fourth sample S04, the thickness of the barrier layer 31 is 10 nm. In growing the low impurity layer 11, two-stage growth is used, a first stage in which the V/III ratio is 490, and a second stage in which the V/III ratio after the first stage is 1949. The configuration and the preparation conditions other than these are the same as those for the first sample S01.

In a fifth sample S05, a low temperature grown AlN layer having a thickness of 18 nm is provided between the low impurity layer 11 and the first semiconductor layer 10. The configuration and the preparation conditions other than this are the same as those for the fourth sample S04. Namely, the thickness of the barrier layer 31 is 10 nm, and two-stage growth is applied to forming the low impurity layer 11.

In a sixth sample S06, the thickness of the barrier layer 31 is 5 nm. The configuration and the preparation conditions other than this are the same as those for the fifth sample S05. Namely, a low temperature grown AlN layer having a thickness of 18 nm is provided between the low impurity layer 11 and the first semiconductor layer 10, and two-stage growth is applied to forming the low impurity layer 11.

In a seventh sample S07, the fourth foundation layer 64 has a configuration in which a stacked layer film formed of the AlN layer 65 having a thickness of 18 nm and the GaN layer having a thickness of 240 nm is stacked in four cycles. The thickness of the low impurity layer 11 is 500 nm. The configuration and the preparation conditions other than these are the same as those for the first sample SO1.

In an eighth sample S08, the thickness of the second foundation layer 62 (an AlGaN layer) is 150 nm, and the thickness of the third foundation layer 63 (an i-GaN layer) is 450 nm. The fourth foundation layer 64 has a configuration in which a stacked layer film formed of the AlN layer 65 having a thickness of 18 nm and the GaN layer having a thickness of 240 nm is stacked in four cycles. The thickness of the low impurity layer 11 is 300 nm. In growing the low impurity layer 11, the V/III ratio is 3987. The thickness of the barrier layer 31 is 10 nm, the number of the barrier layers 31 is five, and the number of the well layers 32 is four. The configuration and the preparation conditions other than these are the same as those for the first sample S01.

In a ninth sample S09, the thickness of the third foundation layer 63 (an i-GaN layer) is 300 nm. In growing the low impurity layer 11, the V/III ratio is 3897. The configuration and the preparation conditions other than these are the same as those for the eighth sample S08.

Figure 8:
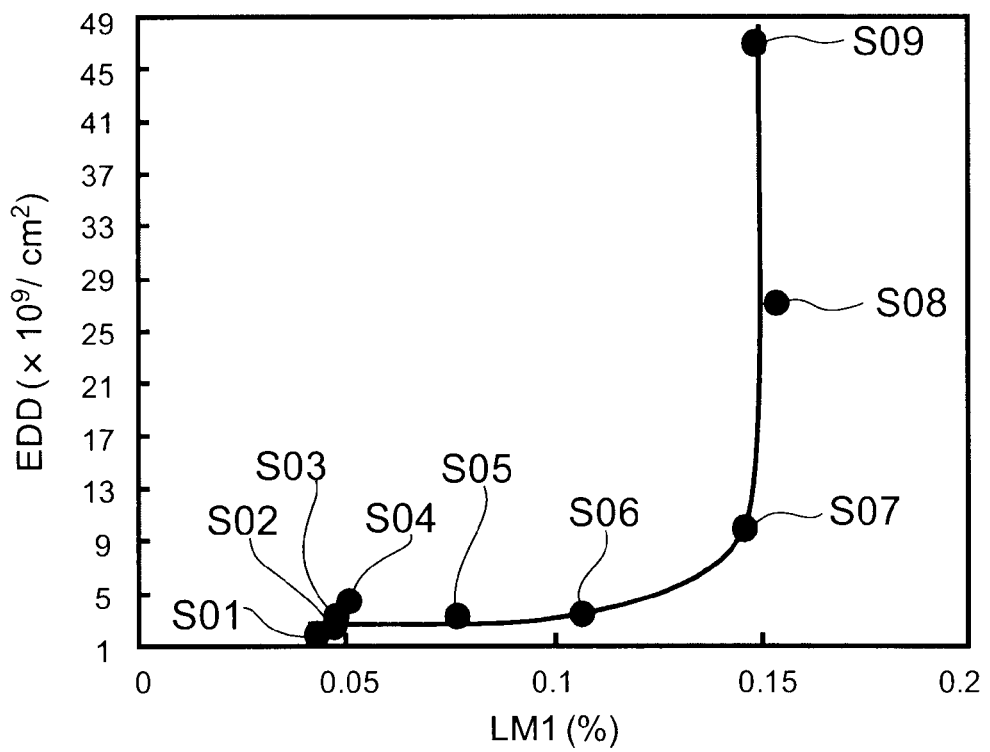

FIG. 8 is a graph illustrating the characteristics of the semiconductor light emitting devices.

FIG. 8 shows the evaluated results of the first sample S01 to the ninth sample S09. The horizontal axis represents the lattice mismatch factor LM1(%) between the first semiconductor layer 10 and the light emitting layer 30. The vertical axis represents an edge dislocation density EDD of the first semiconductor layer 10 ($\times 10^9/cm^2$).

As reveled from FIG. 8, in the first sample S01 to the sixth sample S06, the lattice mismatch factor LM1 is small. In these samples, the lattice mismatch factor LM1 is 0.11% or less. Particularly, in the first sample S01 and the second sample S02, the lattice mismatch factor LM1 is 0.05% or less. On the other hand, in the seventh sample S07 to the ninth sample S09, the lattice mismatch factor LM1 is as large as about 0.15%.

In the first sample S01 to the sixth sample S06, the edge dislocation density EDD is $5\times10^9/cm^2$ or less. On the other hand, in the seventh sample S07 to the ninth sample S09, the edge dislocation density EDD is larger than $5\times10^9/cm^2$. The edge dislocation density EDD of the first sample S01 is $1.86\times10^9/cm^2$. The edge dislocation density EDD of the second sample S02 is $3.37\times10^9/cm^2$. The edge dislocation density EDD of the third sample S03 is $3.24\times10^9/cm^2$. The edge dislocation density EDD of the fourth sample S04 is $3.38\times10^9/cm^2$. The edge dislocation density EDD of the fifth sample S05 is $3.28\times10^9/cm^2$. The edge dislocation density EDD of the sixth sample S06 is $3.38\times10^9/cm^2$. The edge dislocation density EDD of the seventh sample S07 is $9.93\times10^9/cm^2$. The edge dislocation density EDD of the eighth sample S08 is $2.71\times10^{10}/cm^2$. The edge dislocation density EDD of the ninth sample S09 is $4.69\times10^{10}/cm^2$.

Figure 9:
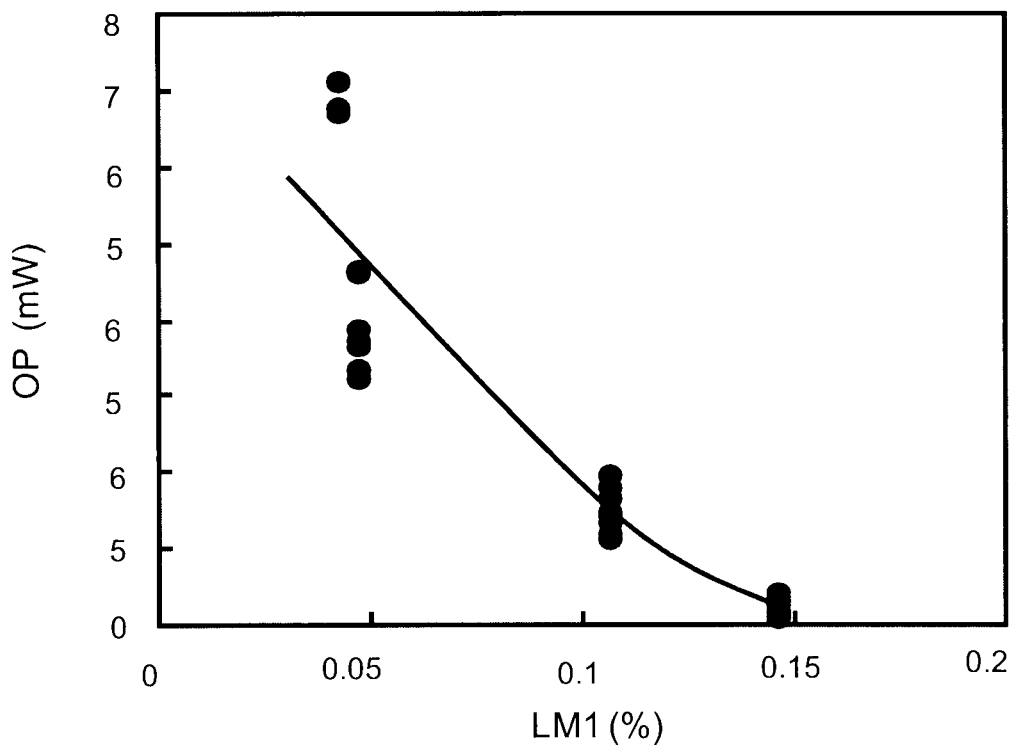

FIG. 9 is a graph illustrating the characteristics of the semiconductor light emitting devices.

FIG. 9 shows the measured results of the optical output of the sample semiconductor light emitting devices including the aforementioned first to ninth samples S01 to S09. The horizontal axis represents the lattice mismatch factor LM1. The vertical axis represents an optical output OP (milliwatt: mW).

As revealed from FIG. 9, when the lattice mismatch factor LM1 is small, the optical output OP becomes large. For example, in the samples having a large lattice mismatch factor LM1 of about 0.15%, the optical output OP ranges from 0.1 mW to 0.5 mW. In the samples having a lattice mismatch factor LM1 of about 0.11%, the optical output OP ranges from 1 mW to 2 mW. In the samples having a lattice mismatch factor LM1 of about 0.05%, the optical output OP ranges from 3.2 mW to 7.1 mW.

In the samples in which the edge dislocation density of the first semiconductor layer 10 is $5\times10^9/cm^2$ or less and the lattice mismatch factor LM1 between the first semiconductor layer 10 and the light emitting layer 30 in the a-axis direction is 0.11% or less, a high optical output OP can be obtained.

In the semiconductor light emitting device 111 according to the embodiment, the first semiconductor layer 10 (the GaN layer) is formed on the silicon substrate 50. Tensile strain is applied to the first semiconductor layer 10 because of a thermal expansion coefficient difference between silicon and GaN.

Figure 10:
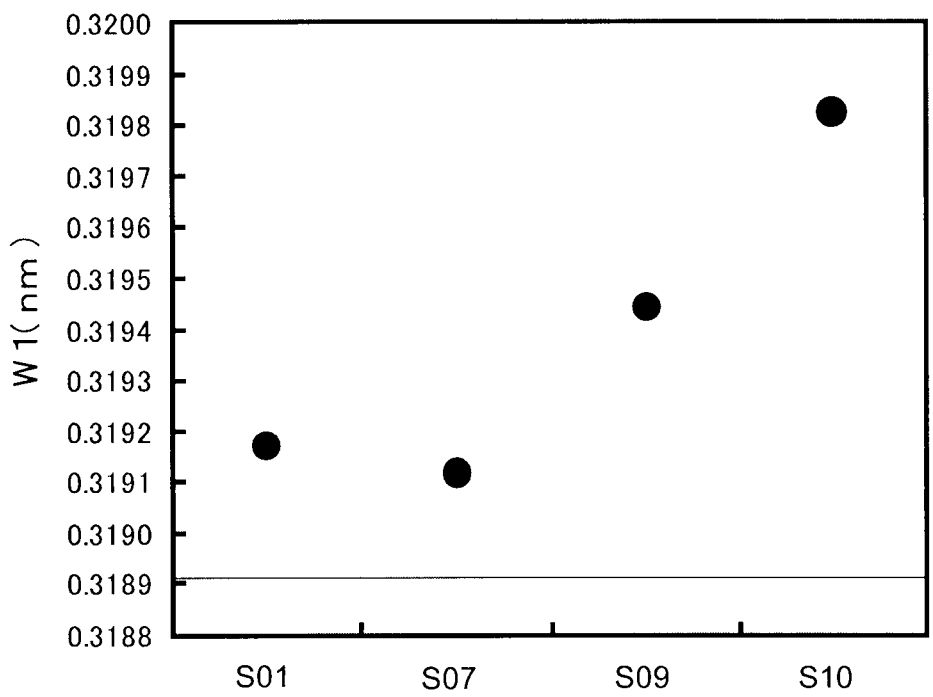

FIG. 10 is a graph illustrating the characteristics of the semiconductor light emitting devices.

FIG. 10 shows the measured results of a lattice length W1 (the lattice length of GaN) of the first semiconductor layer 10 in the a-axis direction in the first sample S01, the seventh sample S07, the ninth sample S09, and a tenth sample S10 that will be explained below. The lattice length W1 is found from Raman spectrometry. In the tenth sample S10, the first foundation layer 61 (an AlN layer) having a thickness of 30 nm, the second foundation layer 62 (an AlGaN layer) having a thickness of 40 nm, and the third foundation layer 63 (a GaN layer) having a thickness of 300 nm are provided on the silicon substrate 50. Low temperature grown AlN having a thickness of 12 nm is provided on the third foundation layer 63, and the first semiconductor layer 10 (an n-type GaN layer having a thickness of 2 μm) is provided thereon. The vertical axis shown in FIG. 10 represents the lattice length W1 of the first semiconductor layer 10 in the a-axis direction. The lattice constant of GaN of the first semiconductor layer 10 in the a-axis direction (the lattice length with no strain applied) is 0.31891 nm.

As shown in FIG. 10, the lattice length W1 of the first sample S01 is 0.31917. The lattice length W1 of the seventh sample S07 is 0.31913. The lattice length W1 of the ninth sample S09 is 0.31945. The lattice length W1 of the tenth sample S10 is 0.31982. As described above, in the first semiconductor layer 10 (the GaN layer) formed on the silicon substrate 50, the lattice length W1 is larger than the lattice constant. For example, when the lattice length W1 is 0.31913 nm, the lattice length W1 of GaN of the first semiconductor layer 10 is increased by about 0.07%. As described above, tensile strain is applied to the first semiconductor layer 10.

Suppose that the lattice constant (the average lattice length) of the light emitting layer 30 is the lattice constant of an $In_\alpha Ga_{1-\alpha}N$ layer having the average In composition ratio α. For example, in the case where the barrier layer 31 is a GaN layer having a thickness of 5 nm, the well layer 32 is an $In_{0.15}Ga_{0.85}N$ layer having a thickness of 3 nm, the number of the barrier layers 31 is nine, and the number of the well layers 32 is eight, the average In composition ratio α is 0.0522. The lattice constant of the light emitting layer 30 in the a-axis direction at this time is 0.32094.

Thus, when tensile strain is applied to the first semiconductor layer 10 and the lattice length W1 is 0.31913 nm, a lattice mismatch between the first semiconductor layer 10 and the light emitting layer 30 is about 0.56%.

On the other hand, in the first semiconductor layer 10 formed on the sapphire substrate, compressive stress is applied to the first semiconductor layer 10 (the GaN layer). The lattice length W1 of the first semiconductor layer 10 in the a-axis direction is 0.31811 nm when the low temperature grown GaN buffer layer is formed on the sapphire substrate, the low impurity layer 11 (the i-GaN layer) is formed thereon, and the first semiconductor layer 10 (the n-type GaN layer), the multi-layer structure unit 40, the light emitting layer 30, and the second semiconductor layer 20 are formed thereon in this order, for example. Namely, the lattice length W1 of GaN of the first semiconductor layer 10 is compressed by about 0.25%. A lattice mismatch between this first semiconductor layer 10 and the light emitting layer 30 is 0.89%.

As described above, in the semiconductor light emitting device 111 according to the embodiment, since tensile strain is applied to the first semiconductor layer 10 and the lattice length W1 of the first semiconductor layer 10 in the a-axis direction is increased, the lattice mismatch between the first semiconductor layer 10 and the light emitting layer 30 is made smaller than the case of using the sapphire substrate.

As shown in FIG. 10, the lattice length W1 of the first semiconductor layer 10 of the first sample S01 is small, whereas the lattice length W1 of the first semiconductor layer 10 of the ninth sample S09 is large. Thus, it is expected that the lattice mismatch between the first semiconductor layer 10 and the light emitting layer 30 will be made smaller in the ninth sample S09 than in the first sample S01. However, as shown in FIG. 8, in the actual experimental results, the lattice mismatch factor LM1 of the first sample S01 is small (0.05%), whereas the lattice mismatch factor LM1 of the ninth sample S09 is large (0.15%).

From this fact, it is difficult to reduce the lattice mismatch factor LM1 only by applying tensile strain to the first semiconductor layer 10 and increasing the lattice length W1 of the first semiconductor layer 10 in the a-axis direction. It can be considered that in this state, the dislocation density (the edge dislocation density EDD) is reduced to allow the critical film thickness of the light emitting layer 30 to come closer to the critical film thickness in the case where no threading dislocation exists for suppressing the lattice mismatch. Thus, it is possible to improve the optical output OP.

As described above, according to the embodiment, it is possible to provide a highly efficient semiconductor light emitting device with a suppressed defect.

Figure 11:
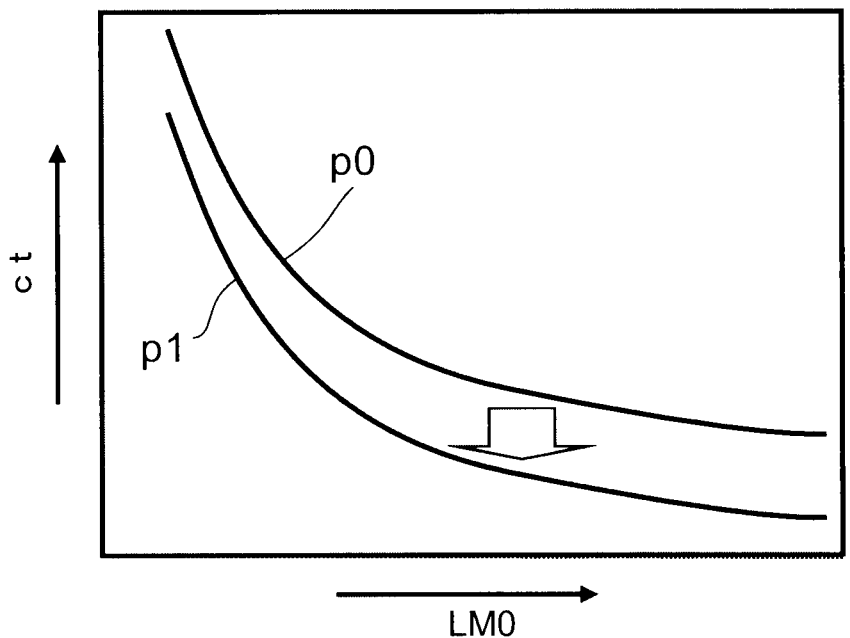

FIG. 11 is a graph illustrating the characteristics of the semiconductor light emitting device.

FIG. 11 is a diagram conceptually showing the relationship between the crystal lattice mismatch and the critical film thickness. The horizontal axis represents a lattice mismatch LM0. The lattice mismatch LM0 is small on the left side in FIG. 11, whereas the lattice mismatch LM0 is large on the right side. In FIG. 11, the In composition ratio of the light emitting layer 30 is more increased from the left side to the right side. The vertical axis represents a critical film thickness ct. The critical film thickness ct is thin on the lower side in FIG. 11, whereas the critical film thickness ct is thick on the upper side. FIG. 11 shows models of a characteristic p0 in the case where there is no defect and a characteristic p1 in the case where there is threading dislocation.

As shown in FIG. 11, when the lattice mismatch becomes large, the critical film thickness ct becomes smaller. It can be considered that the characteristic curve shifts to the lower side (to the left side) in the graph in the case where there is threading dislocation (the characteristic p1), as compared with the case where there is no defect (the characteristic p0). Namely, in the same value of the lattice mismatch LM0, when the dislocation density is increased, the critical film thickness ct becomes thinner than the case where there is no defect (the characteristic p0). In other words, the critical film thickness ct can be made closer to the critical film thickness in the case where there is no threading dislocation, if the dislocation density can be set to some value or less.

Namely, as shown in FIG. 8, the edge dislocation density EDD of the first semiconductor layer 10 is controlled to $5 \times 10^9 / \text{cm}^2$ or less, in the state in which tensile strain is applied to the first semiconductor layer 10 and the lattice length W1 of the first semiconductor layer 10 in the a-axis direction is increased, so that it is possible to make the lattice mismatch factor LM1 between the first semiconductor layer 10 and the light emitting layer 30 in the a-axis direction 0.11% or less. Thus, it is possible to obtain a high optical output OP.

In order to emit a long wavelength light, the In composition ratio of the well layer 32 is increased. Thus, the lattice mismatch between the first semiconductor layer 10 (the GaN layer) and the light emitting layer 30 becomes larger in the case of a long wavelength than in the case of a short wavelength. For example, in the case where the peak wavelength of emitted light is 440 nm or more, the average In composition ratio α of the light emitting layer 30 is 0.05 (that is, 5%) or more. In the embodiment, tensile strain is applied to the first semiconductor layer 10 and the edge dislocation density EDD of the first semiconductor layer 10 is controlled to $5 \times 10^9 / \text{cm}^2$ or less, so that it is possible to reduce the lattice mismatch factor LM1 between the first semiconductor layer 10 and the light emitting layer 30 in the a-axis direction to 0.11% or less, even in the case where the average In composition ratio α of the light emitting layer 30 is 0.05 or more.

As described above, even in the case of emitting a light having a wavelength of 440 nm or more, it is possible to provide a highly efficient semiconductor light emitting device with a suppressed defect.

In the embodiment, for example, the configuration of the buffer layer 60 is designed, so that it is possible to reduce the edge dislocation density. For example, in the fourth foundation layer 64, the AlGaN layer 67 is inserted between the AlN layer 65 and the GaN layer 66, so that it is possible to reduce the edge dislocation density EDD. The growing conditions for the GaN layer used for the foundation crystal layer of the light emitting layer 30 are designed, so that it is possible to reduce the edge dislocation density. For example, the flow rate of $NH_3$ gas is made small (from 20 l/m (liter/minute) to 10 l/m, for example), so that it is possible to reduce the edge dislocation density. The thickness of the low impurity layer 11 is increased, so that it is possible to reduce the edge dislocation density.

In the case where the semiconductor light emitting device is formed on the sapphire substrate, compressive strain is applied to the first semiconductor layer 10. Thus, the lattice mismatch LM0 between the first semiconductor layer 10 and the light emitting layer 30 is large. This large lattice mismatch LM0 is tried to be relaxed by introducing the multi-layer structure unit 40.

In the embodiment, since tensile strain is applied to the first semiconductor layer 10, the lattice mismatch LM0 between the first semiconductor layer 10 and the light emitting layer 30 is small. Thus, the multi-layer structure unit 40 can be omitted.

In the description above, the case is described where the lattice mismatch factor LM1 is used according to Equation 2 for the characteristic value as for the lattice mismatch. However, characteristic values below can be used.

For example, a first normalized lattice mismatch factor LM2(%) expressed by Equation 3 below can be used.

$$LM2 = LM1 / \{(WLEa - W1a) / W1a\} \times 100 (\%) \quad (3)$$

Where W1a is the lattice constant (the lattice length with no strain applied) of the first semiconductor layer 10 in the a-axis direction. WLEa is the lattice constant (the lattice length with no strain applied) of the light emitting layer 30 in the a-axis direction. A lattice constant WLEa of the light emitting layer 30 in the a-axis direction is the lattice constant of $In_\alpha Ga_{1-\alpha}N$ of the average In composition ratio α of the light emitting layer 30.

A second normalized lattice mismatch factor LM3(%) expressed by Equation 4 below can be used.

$$LM3 = LM2 / tLE \times 100 (\%) \quad (4)$$

Where tLE is the thickness of the light emitting layer 30.

Figure 12:
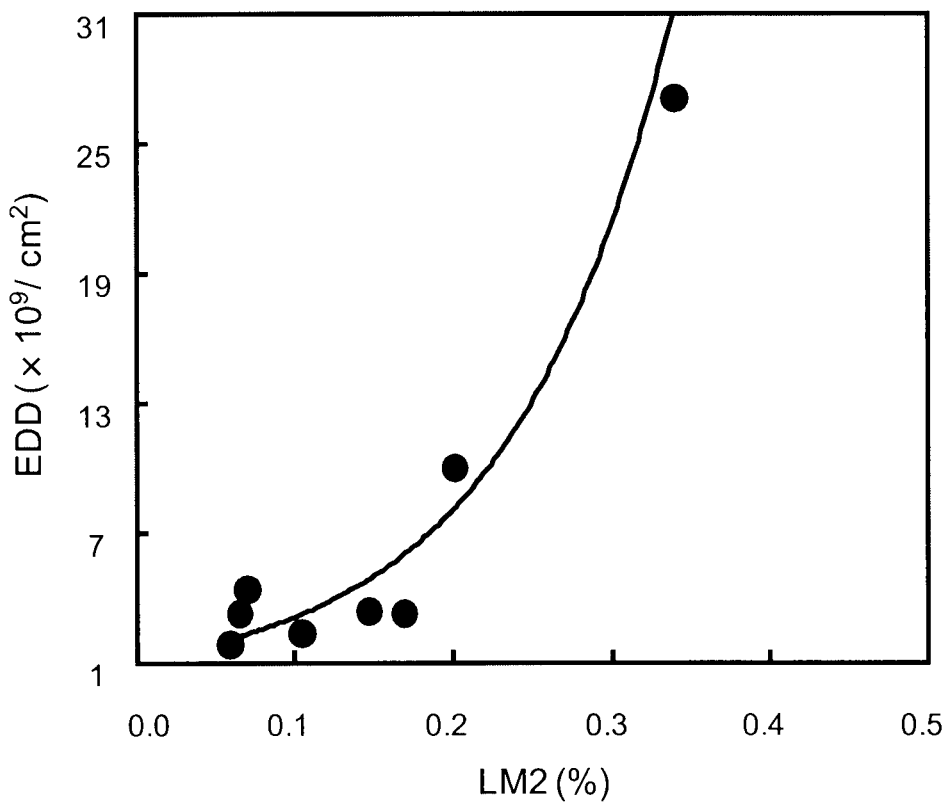

FIG. 12 is a graph illustrating the characteristics of the semiconductor light emitting devices.

FIG. 12 shows the relation ship between the first normalized lattice mismatch factor LM2 and the edge dislocation density EDD as for the first to eighth samples S01 to S08. As revealed from FIG. 12, the edge dislocation density EDD is controlled to $5 \times 10^9 / \text{cm}^2$ or less, so that it is possible to make the first normalized lattice mismatch factor LM2 0.17% or less, even in the case where the average In composition ratio α of the light emitting layer 30 is 0.05 or more.

Figure 13:
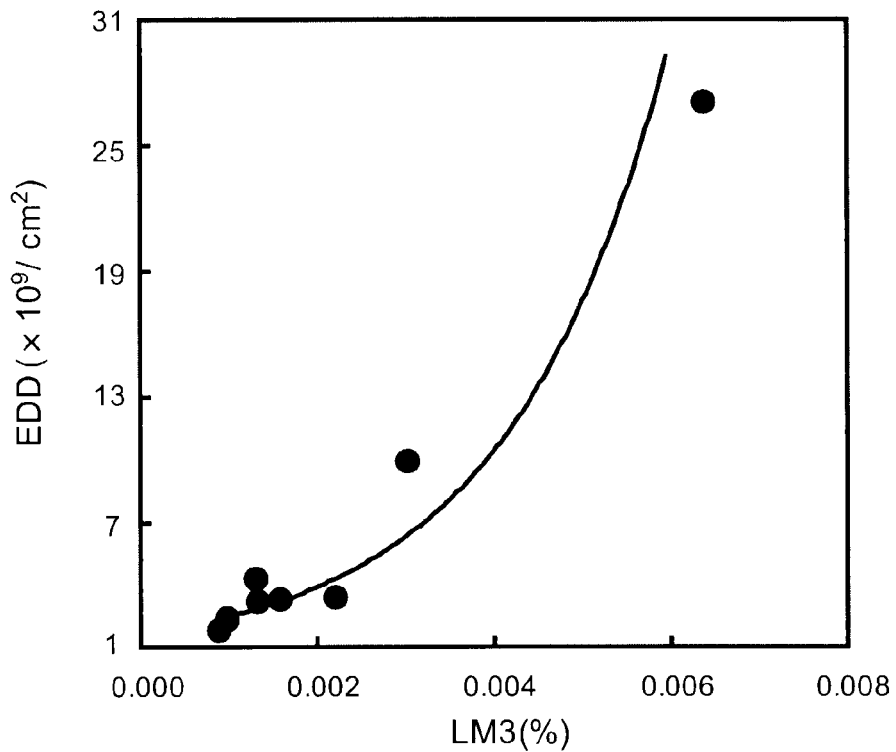

FIG. 13 is a graph illustrating the characteristics of the semiconductor light emitting devices.

FIG. 13 shows the relationship between the second normalized lattice mismatch factor LM3 and the edge dislocation density EDD as for the first to the eighth samples S01 to S08. As revealed from FIG. 13, the edge dislocation density EDD is controlled to $5\times10^9/cm^2$ or less, so that it is possible to make the second normalized lattice mismatch factor LM3 0.0022% or less, even in the case where the average In composition ratio α of the light emitting layer 30 is 0.05 or more.

Figure 14:
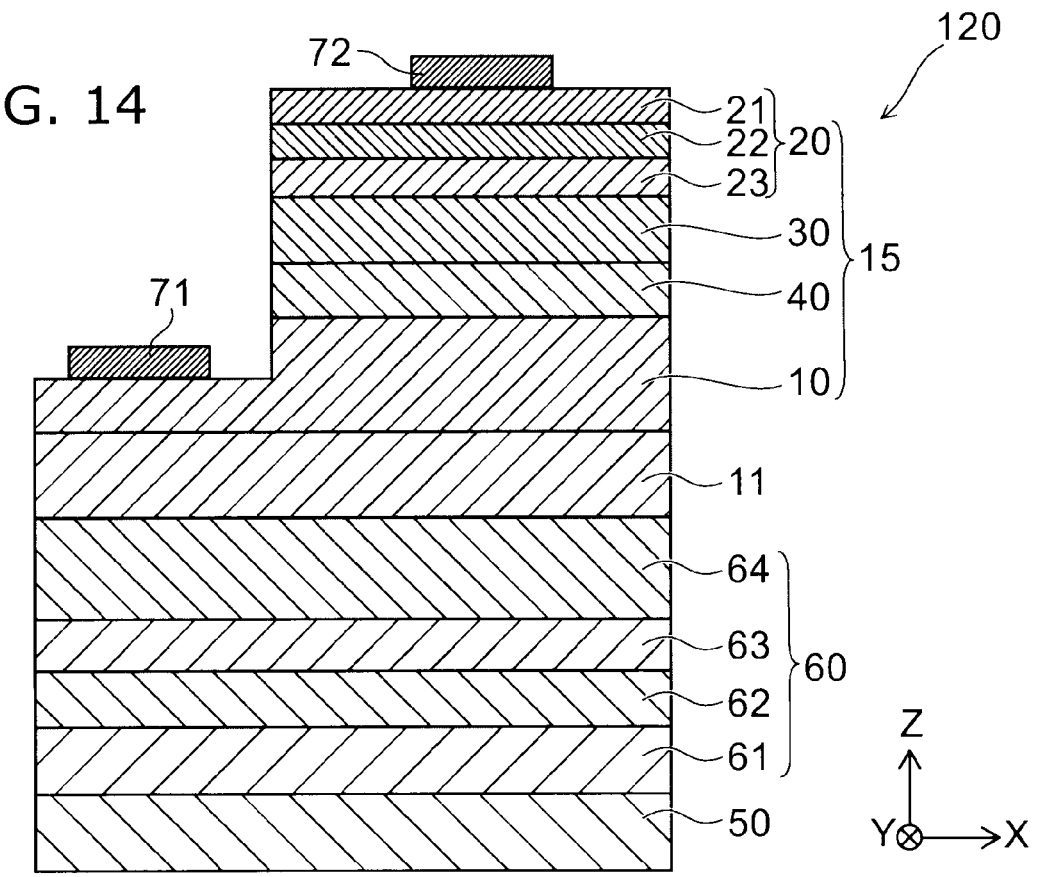
FIG. 14 is a schematic cross-sectional view showing another semiconductor light emitting device according to the first embodiment.

FIG. 14 is a schematic cross-sectional view illustrating the configuration of still another semiconductor light emitting device according to the first embodiment.

As shown in FIG. 14, in a semiconductor light emitting device 120 according to the embodiment, a light emitting layer 30 is provided on a part of a first semiconductor layer 10, and a second semiconductor layer 20 is provided on the light emitting layer 30. A first electrode 71 is provided on the first semiconductor layer 10, and a second electrode 72 is provided on the second semiconductor layer 20. The semiconductor light emitting device 120 is a flip-chip semiconductor light emitting device, for example.

Figure 15:
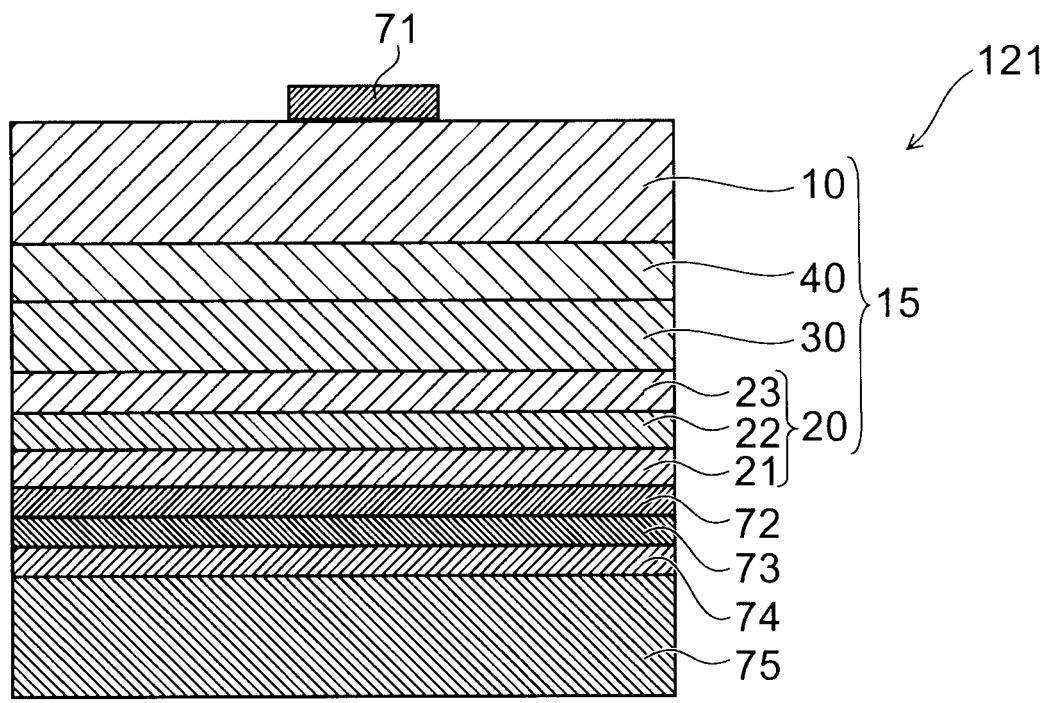
FIG. 15 is a schematic cross-sectional view showing another semiconductor light emitting device according to the first embodiment.

FIG. 15 is a schematic cross-sectional view illustrating the configuration of yet another semiconductor light emitting device according to the first embodiment.

As shown in FIG. 15, in a semiconductor light emitting device 121 according to the embodiment, a silicon substrate 50 used for crystal growth is removed after crystal growth. A support substrate 75 is then provided. A silicon substrate, for example, is used for the support substrate 75. The support substrate 75 can have electrical conductivity. A first electrode 71 is provided on a first semiconductor layer 10, and a second electrode 72 is provided as contacting with a second semiconductor layer 20. A first bonding layer 73 is provided between the second electrode 72 and the support substrate 75, and a second bonding layer 74 is provided between the first bonding layer 73 and the support substrate 75. The semiconductor light emitting device 121 is a thin film semiconductor light emitting device, for example.

Also in the semiconductor light emitting devices 120 and 121, tensile strain is applied to the first semiconductor layer 10, the edge dislocation density EDD of the first semiconductor layer is $5\times10^9/cm^2$ or less, and the lattice mismatch factor LM1 between the first semiconductor layer 10 and the light emitting layer 30 is 0.11% or less. Also in the semiconductor light emitting devices 120 and 121, it is possible to provide a highly efficient semiconductor light emitting device with a suppressed defect.

Second Embodiment

Figure 16:
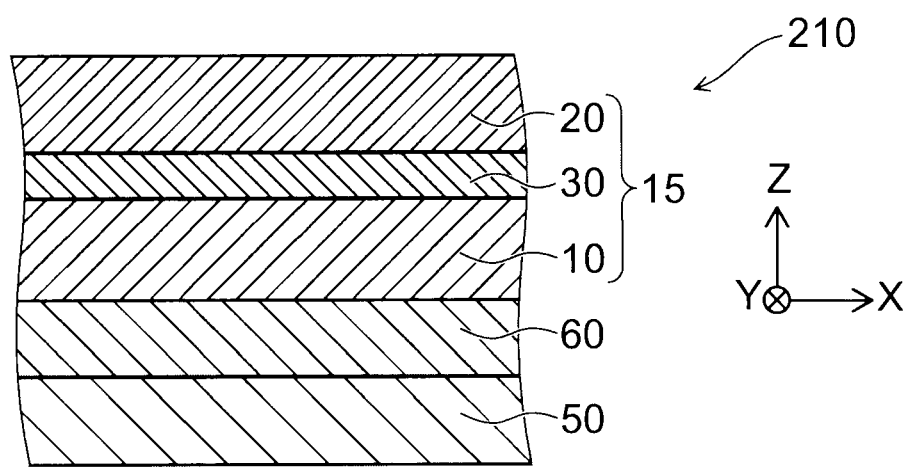
FIG. 16 is a schematic cross-sectional view showing a semiconductor wafer according to a second embodiment.

FIG. 16 is a schematic cross-sectional view illustrating the configuration of a semiconductor wafer according to a second embodiment.

As shown in FIG. 16, a semiconductor wafer 210 according to the embodiment includes a silicon substrate 50, a buffer layer 60 provided on the silicon substrate 50, a first semiconductor layer of a first conductivity type provided on the buffer layer 60, a light emitting layer 30 provided on the first semiconductor layer 10 to emit a light having a peak wavelength of 440 nm or more, and a second semiconductor layer 20 of a second conductivity type provided on the light emitting layer 30. The average In composition ratio of the light emitting layer 30 is 0.05 or more, for example. Tensile strain is applied to the first semiconductor layer 10. The edge dislocation density EDD of the first semiconductor layer 10 is $5\times10^9/cm^2$ or less. The lattice mismatch factor LM1 between the first semiconductor layer 10 and the light emitting layer 30 is 0.11% or less.

Thus, it is possible to provide a highly efficient semiconductor wafer with a suppressed defect.

Figure 17:
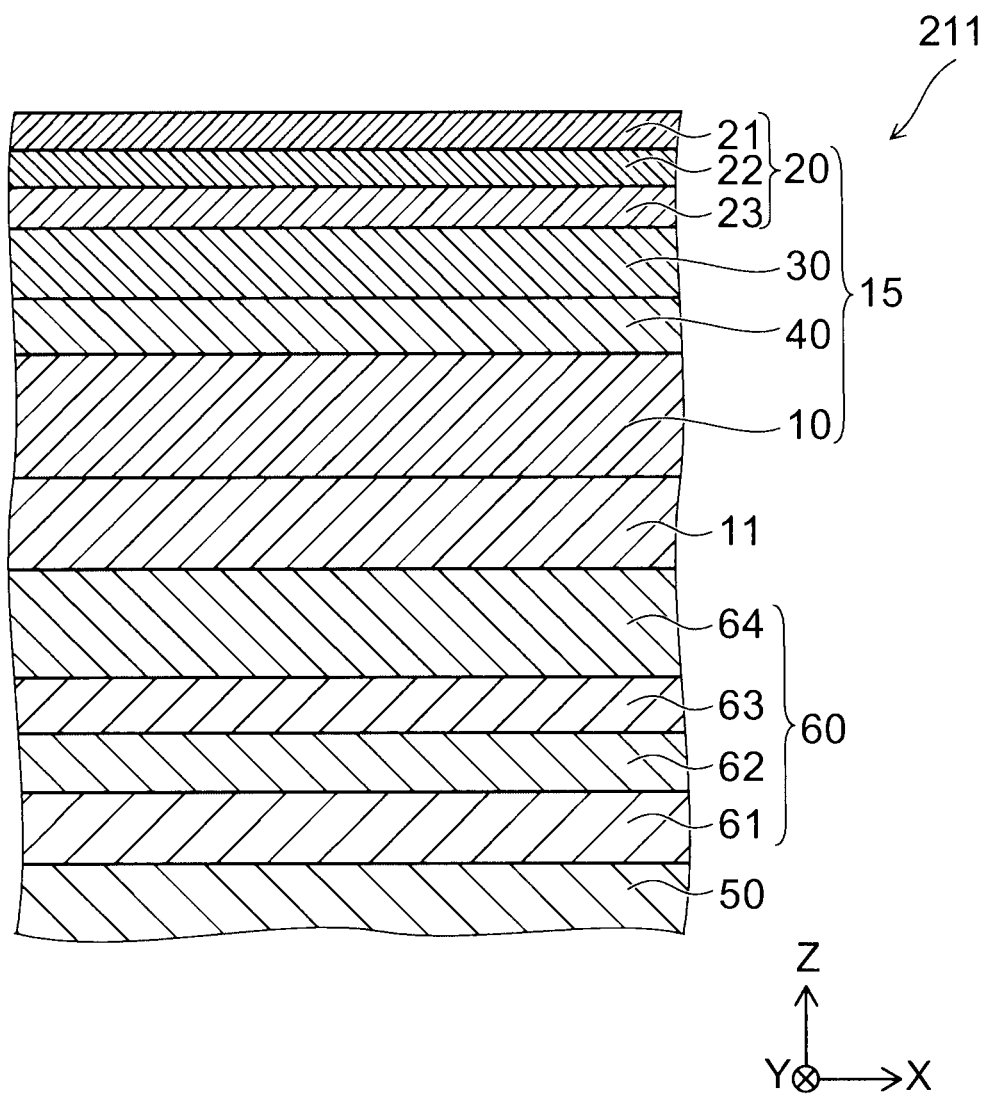
FIG. 17 is a schematic cross-sectional view showing another semiconductor wafer according to the second embodiment.

FIG. 17 is a schematic cross-sectional view illustrating the configuration of another semiconductor wafer according to the second embodiment.

FIG. 17 shows a specific example of the semiconductor light emitting device. As shown in FIG. 17, in a semiconductor wafer 211 according to the embodiment, a buffer layer 60 includes a first foundation layer 61 provided between a silicon substrate 50 and a first semiconductor layer 10 and including AlN, a second foundation layer 62 provided between the first foundation layer 61 and the first semiconductor layer 10 and including $Al_{x1}Ga_{1-x1}N$ (0≤x1≤1), a third foundation layer 63 provided between the second foundation layer 62 and the first semiconductor layer 10 and including GaN, and a fourth foundation layer 64 provided between the third foundation layer 63 and the first semiconductor layer 10.

As described as for FIG. 5, the fourth foundation layer 64 includes a plurality of AlN layers 65 and a plurality of GaN layers 66 alternately stacked. As described as for FIG. 6, the fourth foundation layer 64 can further include an AlGaN layer 67 provided between each of the plurality of GaN layers 65 and the AlN layer 66 on the silicon substrate 50 side of the GaN layer 65. A multi-layer structure unit 40 is provided in this example. However, the multi-layer structure unit 40 may be omitted.

In the embodiment, the following method can be used for growing the semiconductor layers, such as metal-organic chemical vapor deposition (MOCVD), metal-organic chemical vapor deposition (MOVPE), molecular beam epitaxy (MBE), and halide vapor-phase epitaxy (HVPE), for example.

For example, in the case of using MOCVD or MOVPE, the following can be used for raw materials in forming the semiconductor layers. TMGa (trimethylgallium) and TEGa (triethyl gallium), for example, can be used for a raw material of Ga. TMIn (trimethylindium), TEIn (triethylindium), and the like, for example, can be used for a raw material of In. TMAl (trimethylaluminum) and the like, for example, can be used for a raw material of Al. $NH_3$ (ammonia), MMHy (monomethylhydrazine), DMHy (dimethylhydrazine), and the like, for example, can be used for a raw material of N. $SiH_4$ (monosilane), $Si_2H_6$ (disilane), and the like can be used for a raw material of Si.

According to the embodiment, it is possible to provide a highly efficient semiconductor light emitting device and semiconductor wafer with a suppressed defect.

In the specification, the term "nitride semiconductor" includes semiconductors having all compositions in which composition ratios x, y, and z are changed within the ranges in a chemical formula $BxIN_yAl_zGa_{1-x-y-z}N$ (0≤x≤1, 0≤y≤1, 0≤z≤1, x+y+z≤1). The term "nitride semiconductor" also includes, in the chemical formula, those further include V group elements other than N (nitrogen), those further include various elements added to control various physical properties such as a conductivity type, and those further include various elements contained unintentionally.

As described above, the embodiments according to the invention are explained with reference to specific examples. However, the embodiments according to the invention are not limited to these specific examples. For example, as for the specific configurations of the components such as the first semiconductor layer, the second semiconductor layer, the light emitting layer, the well layer, the barrier layer, the foundation layer, the buffer layer, the low impurity layer, the electrode, the support substrate, and the bonding layer included in the semiconductor light emitting device and the wafer, they are included in the scope of the invention as long as a person skilled in the art may appropriately select them from a publicly known range and similarly implement the invention for obtaining similar effects.

Further, any two or more components of the specific examples may be combined within the extent of technical feasibility and are included in the scope of the invention to the extent that the purport of the invention is included.

In addition to this, all of semiconductor light emitting devices and semiconductor wafers that can be implemented by a person skilled in the art to appropriately modify and alter design based on the foregoing semiconductor light emitting devices and semiconductor wafers described as the embodiments of the invention are also included in the scope of the invention as long as they include the teachings of the invention.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting device comprising:
a first semiconductor layer of a first conductivity type;
a second semiconductor layer of a second conductivity type; and
a light emitting layer provided between the first semiconductor layer and the second semiconductor layer and configured to emit a light having a peak wavelength of 440 nanometers or more,
tensile strain in a direction perpendicular to a direction from the first semiconductor layer toward the second semiconductor layer being applied to the first semiconductor layer,
an edge dislocation density of the first semiconductor layer being $5 \times 10^9/cm^2$ or less, the edge dislocation density being obtained from a rocking curve half width of a symmetry plane and an asymmetry plane of the first semiconductor layer in X-ray diffraction measurement, and
a lattice mismatch factor between the first semiconductor layer and the light emitting layer being 0.11 percent or less.

2. The device according to claim 1, further comprising:
a silicon substrate, the first semiconductor layer being disposed between the silicon substrate and the second semiconductor layer; and
a buffer layer provided between the silicon substrate and the first semiconductor layer and including a nitride semiconductor.

3. The device according to claim 2,
wherein the buffer layer includes:
a first foundation layer provided between the silicon substrate and the first semiconductor layer and including AlN;
a second foundation layer provided between the first foundation layer and the first semiconductor layer and including $Al_{x1}Ga_{1-x1}N$ ($0 \leq x1 \leq 1$);

a third foundation layer provided between the second foundation layer and the first semiconductor layer and including GaN; and
a fourth foundation layer provided between the third foundation layer and the first semiconductor layer and including a plurality of AlN layers and a plurality of GaN layers alternately stacked.

4. The device according to claim 3, wherein number of the plurality of AlN layers of the fourth foundation layer and number of the plurality of GaN layers of the fourth foundation layer are not less than 2 and not more than 10.

5. The device according to claim 3,
wherein the fourth foundation layer further includes an AlGaN layer provided between each of the plurality of GaN layers and the AlN layer on a silicon substrate side of each of the plurality of GaN layers.

6. The device according to claim 1,
wherein the light emitting layer has a well layer including In and an average In composition ratio of the light emitting layer is 0.05 or more.

7. The device according to claim 1, wherein
the light emitting layer includes a plurality of barrier layers and a well layer provided between the plurality of barrier layers,
the barrier layers include GaN, and
the well layer includes $In_{w0}Ga_{1-w0}N$ ($0<w0<1$).

8. The device according to claim 7, wherein the well layer is provided in a plurality.

9. The device according to claim 1, wherein the first conductivity type is an n-type and the second conductivity type is p-type.

10. The device according to claim 1, wherein the first semiconductor layer, the second semiconductor layer and the light emitting layer include a nitride semiconductor.

11. The device according to claim 1, further comprising a support substrate,
the second semiconductor layer being disposed between the support substrate and the light emitting layer.

12. A semiconductor wafer comprising:
a silicon substrate;
a buffer layer provided on the silicon substrate;
a first semiconductor layer of a first conductivity type provided on the buffer layer;
a light emitting layer provided on the first semiconductor layer and configured to emit a light having a peak wavelength of 440 nanometer or more; and
a second semiconductor layer of a second conductivity type provided on the light emitting layer,
tensile strain in a direction perpendicular to a direction from the first semiconductor layer toward the second semiconductor layer being applied to the first semiconductor layer,
an edge dislocation density of the first semiconductor layer being $5 \times 10^9/cm^2$ or less, the edge dislocation density being obtained from a rocking curve half width of a symmetry plane and an asymmetry plane of the first semiconductor layer in X-ray diffraction measurement, and
a lattice mismatch factor between the first semiconductor layer and the light emitting layer being 0.11 percent or less.

13. The wafer according to claim 12,
wherein the buffer layer includes:
a first foundation layer provided between the silicon substrate and the first semiconductor layer and including AlN;

a second foundation layer provided between the first foundation layer and the first semiconductor layer and including $Al_{x1}Ga_{1-x1}N$ (0≤x1≤1);

a third foundation layer provided between the second foundation layer and the first semiconductor layer and including GaN; and a fourth foundation layer provided between the third foundation layer and the first semiconductor layer and including a plurality of AlN layers and a plurality of GaN layers alternately stacked.

14. The wafer according to claim 13, wherein number of the plurality of AlN layers of the fourth foundation layer and number of the plurality of GaN layers of the fourth foundation layer are not less than 2 and not more than 10.

15. The wafer according to claim 13, wherein the fourth foundation layer further includes an AlGaN layer provided between each of the plurality of GaN layers and the AlN layer on a silicon substrate side of each of the plurality of GaN layers.

16. The wafer according to claim 12, wherein the light emitting layer has a well layer including In and an average In composition ratio of the light emitting layer is 0.05 or more.

17. The wafer according to claim 12, wherein
the light emitting layer includes a plurality of barrier layers and a well layer provided between the plurality of barrier layers,
the barrier layers include GaN, and
the well layer includes $In_{w0}Ga_{1-w0}N$ (0<w0<1).

18. The wafer according to claim 12, wherein the first conductivity type is an n-type and the second conductivity type is p-type.

19. The wafer according to claim 12, wherein the first semiconductor layer, the second semiconductor layer and the light emitting layer include a nitride semiconductor.

20. The wafer according to claim 12, further comprising:
a low impurity concentration layer provided between the buffer layer and the first semiconductor layer,
an impurity concentration in the low impurity concentration layer being lower than an impurity concentration in the first semiconductor layer.

21. The device according to claim 1, further comprising:
a low impurity concentration layer, the first semiconductor layer being provided between the first low impurity concentration layer and the light emitting layer,
an impurity concentration in the low impurity concentration layer being lower than an impurity concentration in the first semiconductor layer.

* * * * *